(12) United States Patent
Kawamoto et al.

(10) Patent No.: US 11,201,033 B2
(45) Date of Patent: Dec. 14, 2021

(54) CHARGED PARTICLE BEAM DEVICE AND ELECTROSTATIC LENS

(71) Applicant: Hitachi High-Technologies Corporation, Tokyo (JP)

(72) Inventors: Yuta Kawamoto, Tokyo (JP); Akira Ikegami, Tokyo (JP); Masahiro Fukuta, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 35 days.

(21) Appl. No.: 16/664,100

(22) Filed: Oct. 25, 2019

(65) Prior Publication Data

US 2020/0185186 A1     Jun. 11, 2020

(30) Foreign Application Priority Data

Dec. 6, 2018     (JP) .............................. JP2018-229449

(51) Int. Cl.
| | | |
|---|---|---|
| *H01J 37/00* | (2006.01) | |
| *H01J 37/147* | (2006.01) | |
| *H01J 37/12* | (2006.01) | |
| *H01J 37/28* | (2006.01) | |

(52) U.S. Cl.
CPC .......... *H01J 37/1475* (2013.01); *H01J 37/12* (2013.01); *H01J 37/28* (2013.01); *H01J 2237/0473* (2013.01)

(58) Field of Classification Search
USPC .................................................... 250/396 R
See application file for complete search history.

(56) References Cited

U.S. PATENT DOCUMENTS

| | | | | |
|---|---|---|---|---|
| 4,698,503 A | * | 10/1987 | Nomura | H01J 37/265 250/311 |
| 4,945,237 A | * | 7/1990 | Shii | H01J 37/21 250/307 |
| 6,593,152 B2 | * | 7/2003 | Nakasuji | G01N 23/225 250/492.3 |
| 10,446,361 B2 | * | 10/2019 | Cheng | H01J 37/1474 |
| 2007/0089313 A1 | | 4/2007 | Seitz et al. | |
| 2017/0345613 A1 | | 11/2017 | Mizuhara et al. | |

FOREIGN PATENT DOCUMENTS

| | | |
|---|---|---|
| JP | 2007-532893 A | 11/2007 |
| WO | WO 2016/092642 A1 | 6/2016 |

* cited by examiner

*Primary Examiner* — Phillip A Johnston
(74) *Attorney, Agent, or Firm* — Crowell & Moring LLP

(57) ABSTRACT

To provide a charged particle beam device capable of preventing generation of geometric aberration by aligning axes of electrostatic lenses with high accuracy even when center holes of respective electrodes which constitute the electrostatic lens are not disposed coaxially. The charged particle beam device according to the invention includes an electrostatic lens disposed between an acceleration electrode and an objective lens, wherein at least one of the electrodes which constitutes the electrostatic lens is formed of a magnetic body, and two or more magnetic field generating elements are disposed along an outer periphery of the electrode.

28 Claims, 9 Drawing Sheets

CHARGED PARTICLE BEAM DEVICE AND ELECTROSTATIC LENS

TECHNICAL FIELD

The present invention relates to a charged particle beam device which emits a charged particle beam to a sample.

BACKGROUND ART

A charged particle beam device such as a scanning electron microscope (SEM) is used for measurement and inspection of fine semiconductor device patterns. The scanning electron microscope is a device which measures a sample using an image obtained by scanning the sample with a focused electron beam. The scanning electron microscope focuses the electron beam by generating a focusing field using an electromagnetic lens or an electrostatic lens. The electromagnetic lens includes a plurality of magnetic bodies and coils. The electrostatic lens includes a plurality of electrodes insulated from each other.

When intensity of the focusing field is desired to be changed at a high speed or when highly accurate reproducibility of the focusing field is important, an electrostatic lens having no hysteresis is often used. Unlike the electromagnetic lens, the electrostatic lens does not have a rotational action of the electron beam, and thus has an advantage of simplifying the control. Since a large amount of aberration is generated in a deceleration electrostatic lens used by applying a negative voltage to the electrode, the electrostatic lens is also effective as an aberration generation source used to correct an off-axis aberration of an objective lens. It is often necessary for an acceleration electrostatic lens used by applying a positive voltage to the electrode to have a high voltage, but since the aberration is smaller than that of the deceleration electrostatic lens, the electron beam can be focused on a smaller spot.

The focusing field of the electrostatic lens is formed by a potential gradient generated between the plurality of electrodes to which different voltages are applied. Therefore, the electrodes need to be separated by an insulating material such as a resin material or a ceramic. A hole for allowing the electron beam to pass through is provided at a center of each electrode. In order to generate an ideal focusing field, it is important to coaxially dispose the center holes of respective electrodes. When the center holes are not disposed coaxially, a large geometric aberration is generated in the electrostatic lens, and spatial resolution is decreased.

In order to prevent the generation of the large geometric aberration in the electrostatic lens, it is necessary to coaxially dispose the center holes of respective electrodes which constitute the electrostatic lens. As a factor of an axis deviation of the center hole, a tolerance design such as clearance fit considering the machining accuracy of an insulating member inserted between the electrodes and workability during assembly can be considered. These can be improved by an assembly process using a three-dimensional measuring machine shown in PTL 1 or by imposing a stricter machining tolerance on each component.

The following PTL 2 describes a scanning electron microscope having a multistage electrostatic lens. PTL 2 describes a configuration example in which a charged particle converged by the multistage electrostatic lens is deflected by a deflector.

PRIOR ART LITERATURE

Patent Literature

PTL 1: JP-A-2007-532893
PTL 2: WO 2016/092642

SUMMARY OF INVENTION

Technical Problem

When the three-dimensional measuring machine as described in PTL 1 is used, the axis deviation of the center hole of each electrode can be adjusted to about several micrometers. However, since it is necessary to acquire the position by touching respective electrodes which constitute the electrostatic lens with a measuring probe, there is a case where a foreign substance remains on a surface of the electrode or damage is caused on the surface of the electrode. Since a high voltage of several kV to several tens of kV is supplied to the electrodes which constitute the electrostatic lens, there is a possibility that discharge is generated even by a very small foreign substance. In a field where an inner diameter of the center hole is small, when there is a foreign substance of about several tens of micrometers on the surface of the electrode, the geometric aberration is generated by the foreign substance. Depending on the structure of the electrostatic lens, it may be difficult to touch each electrode with a probe after assembly.

When strict machining accuracy is required on each component, the axis deviation of the center hole can be reduced according to the tolerance, but the accuracy of about several micrometers obtained by the three-dimensional measuring machine cannot be expected. In addition, the yield of a machining process may be decreased and a failure during the assembly may be caused.

According to the technique described in PTL 2, the correction of the geometric aberration by the deflector when the geometric aberration is generated due to the electrostatic lens is not considered. When the deflector is used to correct the geometric aberration, fine adjustment of the deflector is necessary in order to generate a deflection field enough to correct a slight axis deviation of the center hole of respective electrodes by an individual deflector.

The invention is made in view of the above problems, and an object thereof is to provide a charged particle beam device capable of preventing generation of a geometric aberration by aligning axes of electrostatic lenses with high accuracy even when center holes of respective electrodes which constitute an electrostatic lens are not disposed coaxially.

Solution to Problem

A charged particle beam device according to the invention includes an electrostatic lens disposed between an acceleration electrode and an objective lens, and at least one of electrodes which constitute the electrostatic lens is formed of a magnetic body, and two or more magnetic field generating elements are disposed along an outer periphery of the electrode.

Advantageous Effect

According to the charged particle beam device of the invention, a geometric aberration caused by an axis deviation of the electrostatic lens can be prevented. Accordingly, the decrease in spatial resolution can be prevented, which thus contributes to improvement in the performance of the charged particle beam device.

DESCRIPTION OF EMBODIMENTS

First Embodiment

Figure 1:
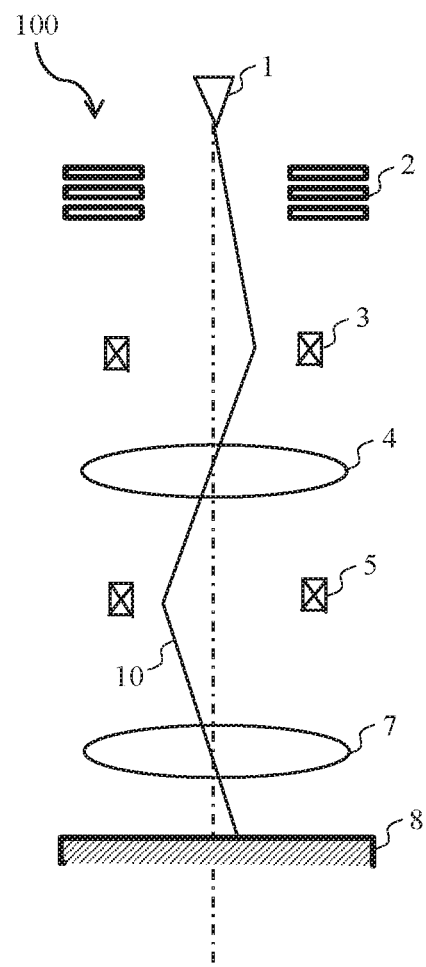
FIG. 1 is a schematic diagram showing a configuration of a charged particle beam device 100.

FIG. 1 is a schematic diagram showing a configuration of a charged particle beam device 100. Here, an example in which the charged particle beam device 100 is configured as a scanning electron microscope will be described. An electron beam 10 extracted from an electron source 1 by an acceleration electrode 2 is focused by an objective lens 7 and emitted to a sample 8. An intermediate lens 4 is disposed between the objective lens 7 and the acceleration electrode 2. The intermediate lens 4 is used to control a current amount of the electron beam 10 emitted to the sample 8 and an opening angle of the electron beam 10 on the sample 8. The intermediate lens 4 may include a plurality of condenser lenses or electrostatic lenses. In the following description, the intermediate lens 4 is configured as an electrostatic lens.

A scanning electron microscope is adjusted to pass the electron beam 10 through a wobbler center of each lens. The wobbler center is a position where the electron beam 10, which is configured to minimize a moving amount of a SEM image when a current value or a voltage value supplied to the condenser lens or the electrostatic lens is changed, passes through. The lens may be mechanically moved or the electron beam 10 may be electrically deflected using an electromagnetic or electrostatic deflector 3, so as to minimize the moving amount of the SEM image. The deflector 3 may be a plurality of deflectors and preferably has two or more stages. After the electron beam 10 passes through the intermediate lens 4, the objective lens 7 is adjusted using the deflector 5 so as to pass the electron beam 10 through the wobbler center similarly. The deflector 5 may be a plurality of deflectors and preferably has two or more stages. In this way, since a chromatic aberration of the lens can be minimized by adjusting the electron beam 10 to pass through the wobbler center of each lens, a high spatial resolution can be obtained particularly in the scanning electron microscope which observes the sample 8 at a low acceleration voltage.

Figure 2:
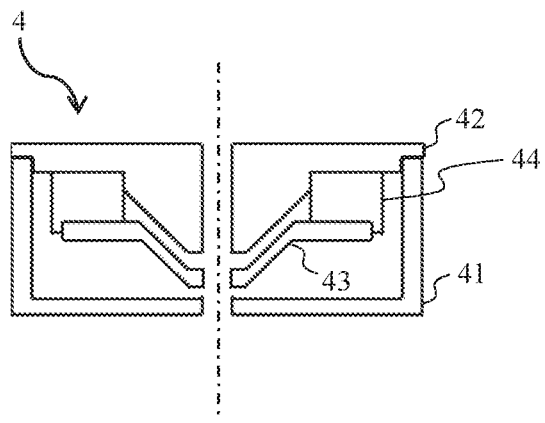
FIG. 2 is a side view illustrating a configuration example of an electrostatic lens.

FIG. 2 is a side view illustrating a configuration example of the electrostatic lens. Here, an Einzel lens including three electrodes is illustrated, and the number of electrodes may be at least two or more. In addition, an acceleration or deceleration immersion lens in which the energy of the electron beam changes after the electron beam passes through a space where a focusing field exists may be used.

In FIG. 2, an electrode 43 is sandwiched between an electrode 41 and an electrode 42 via an insulating member 44. By applying a predetermined voltage to the electrode 43 and applying a voltage different from the predetermined voltage to the electrode 41 and/or the electrode 42, a desired focusing field (electric field) can be generated for the electrostatic lens. The voltage applied to the electrode 41 and the electrode 42 may be a ground voltage. The electrodes or the electrodes and the insulating member 44 are fixed to each other with screws or the like. FIG. 2 illustrates a case where all inner diameters of center holes of the electrodes 41 to 43 are the same, but the inner diameters may be different for respective electrodes. The electrostatic lens is formed by a potential gradient generated by a potential difference between the electrode 43 and the electrode 41 and a potential difference between the electrode 43 and the electrode 42, and thus the electron beam 10 is focused. When the center hole of each electrode is rotationally symmetric, the focusing field is also rotationally symmetric, but when the center hole of each electrode is an ellipse or has a large irregularity, an electric field which is not rotationally symmetric may be generated, and thus a large geometric aberration may be generated.

The electrostatic lens is usually designed such that the center holes of respective electrodes are disposed coaxially. Each component is machined into a dimension and shape controlled with machining tolerance such that each component can be combined at a fitting portion. In the example of FIG. 2, an outer diameter portion of the electrode 42 and an inner diameter portion of the electrode 41, and an inner diameter portion of the insulating member 44 and an outer diameter portion of each of the electrode 42 and the electrode 43 have fitting portions. The tolerance of each component which constitutes the fitting portion is determined by an assembly method according to the application, such as clearance fit or interference fit. Since as the number of the fitting portions increases, the axis deviation of the center hole between the electrodes increases, it is necessary to reduce the number of the fitting portions and to set the tolerance of each component of the fitting portion more strictly in order to reduce the axis deviation.

In the electrostatic lens illustrated in FIG. 2, when the machining tolerance is set such that respective fitting portions are in clearance fit, the axis deviation of the center holes of the electrode 42 and the electrode 43 is about 50 micrometers to 60 micrometers at maximum. When there is such a deviation of the center axis, an unexpected aberration is generated due to the generation of the electric field which is not rotationally symmetric. When the center hole is finely adjusted while measuring the amount of the axis deviation using a three-dimensional measuring machine during the assembly, the axis deviation can be reduced to about several micrometers. However, since it is necessary to touch the electrode with a probe during the measurement, there is a case where a foreign substance is on a surface of the electrode or damage is caused on the surface of the electrode. In this case as well, the electric field which is not rotationally symmetric may be generated and a large geometric aberration may be generated.

Figure 3:
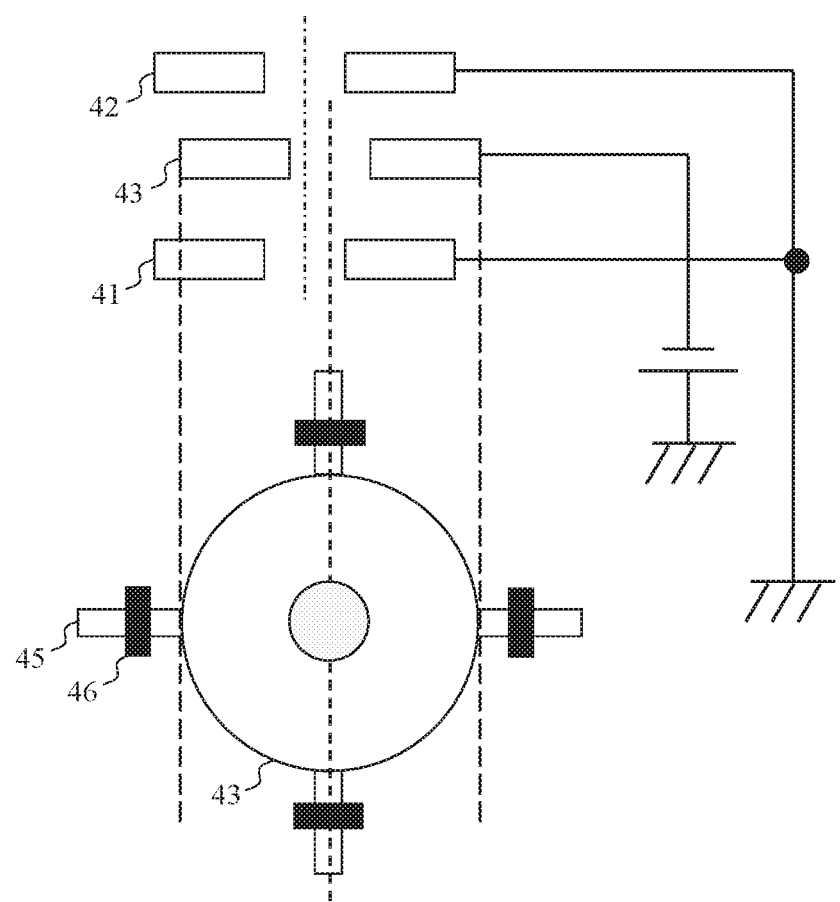
FIG. 3 is a diagram schematically showing a configuration of an intermediate lens 4.

FIG. 3 is a diagram schematically showing a configuration of the intermediate lens 4. The upper part of FIG. 3 is a side view schematically showing deviations of the center holes of the electrodes 41 to 43. The electrode 41 and the electrode 42 are grounded, and a negative voltage is applied to the electrode 43. The center hole of the electrode 43 has an axis deviation with respect to the center holes of the electrode 41 and the electrode 42. When such an axis deviation is generated, a deflection field is generated in addition to the rotationally symmetric focusing field. When the deflection field is generated, the electron beam is deflected by the deflection field when the electron beam is adjusted to pass through the wobbler center of the electrostatic lens. Then, in order to minimize the moving amount of the SEM image, the electron beam 10 must pass through a position different from the wobbler center when only the focusing field exists. In this case, the chromatic aberration of the electrostatic lens including the deflection field generated due to the axis deviation is reduced, but the geometric aberration is not minimized and the spatial resolution is decreased. Therefore, it is not possible to minimize both the chromatic aberration and the geometric aberration only by adjusting the electron beam 10 to pass through the wobbler center of the electrostatic lens. In addition, an aberration not generated in the rotationally symmetric focusing field due to the deflection field is also generated at the same time, and the spatial resolution may also be decreased due to this aberration.

The lower part of FIG. 3 is a top view of the electrode 43. At least two magnetic field generating elements (magnetic bar 45 and coil 46) are disposed on an outer peripheral portion of the electrode 43. The electrode 43 is formed of a magnetic body such as permalloy or pure iron. The magnetic field generating element is an element provided to eliminate the deflection field generated due to the axis deviation of the electrode. The magnetic field generating element is preferably disposed to be at least two-fold rotationally symmetric on the outer peripheral portion of the electrode 43. When the deflection field is eliminated with respect to the axis deviation between the electrodes in any direction, the magnetic field generating element may be disposed to be four-fold rotationally symmetric.

When a current is supplied in the same direction to the two opposing coils 46, since the electrode 43 is a magnetic body, most of magnetic force lines pass through an inside of the electrode 43, but since the magnetic force lines leak slightly inside the center hole, a weak deflection field is generated inside the center hole of the electrode 43. In the first embodiment, in order to eliminate the deflection field caused by the axis deviation between the electrodes, this weak deflection field is used.

On the contrary, in order to obtain a strong deflection magnetic field, it is effective to divide a center hole portion of the electrode 43. However, since the focusing field of the electrostatic lens is not rotationally symmetric with such an electrode shape, an ideal rotationally symmetric focusing field cannot be obtained even when each electrode has no axis deviation. Therefore, in the first embodiment, the deflection field is corrected by the magnetic force line which leaks slightly to the center hole of the electrode 43.

Figure 4:
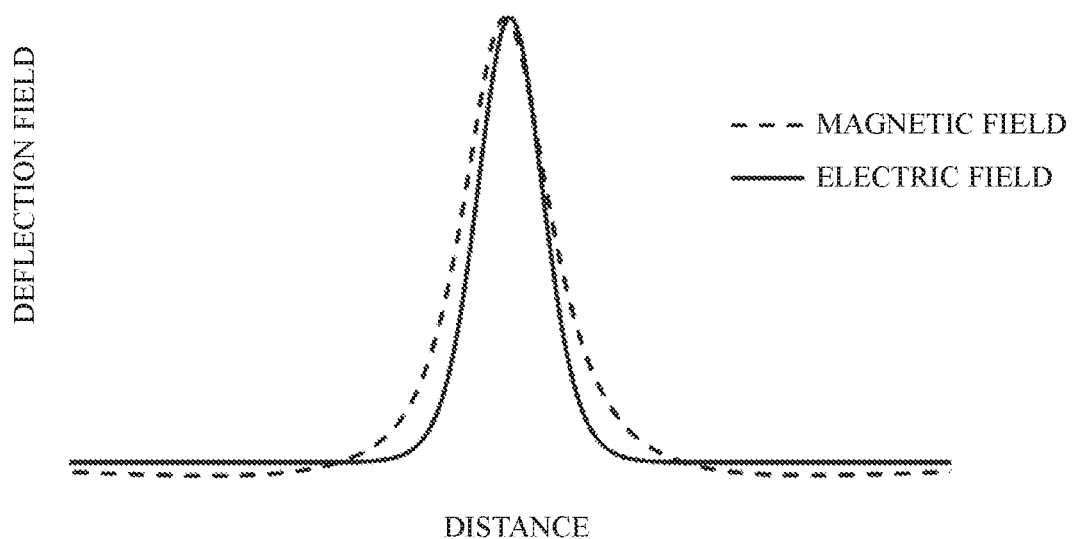
FIG. 4 shows an example of a distribution of a deflection electric field generated by an axis deviation shown in FIG. 3 and a deflection magnetic field generated by using a magnetic field generating element.

FIG. 4 shows an example of a distribution of a deflection electric field generated by the axis deviation shown in FIG. 3 and a deflection magnetic field generated by using the magnetic field generating element. Since the deflection electric field is generated by the axis deviation of the electrode 43 and the magnetic field generating element is also disposed on the outer peripheral portion of the electrode 43, deflection fields of both the electric field and the magnetic field are generated by the same component. Therefore, peak positions and distribution shapes of respective deflection fields can be made close to each other. The distribution of the deflection magnetic field can be controlled by means of controlling the material or shape of the electrode 41, embedding an additional electrode (not shown) into the electrode 41 and the electrode 42, and disposing an additional electrode (not shown) around the electrode 41 and the electrode 42.

By controlling the current amount supplied to the coil 46, it is possible to prevent unexpected aberration caused by the axis deviation of the center hole of respective electrodes which constitute the electrostatic lens, so as to eliminate the deflection of the electron beam 10 caused by the axis deviation of the electrode. Accordingly, the deflection field can be corrected such that the chromatic aberration and the geometric aberration are minimized at the same time.

FIG. 3 shows the case where the electrode 43 is disposed to be deviated, but even when the electrode 41 or the electrode 42 is axially deviated, the same effect can be achieved by disposing the magnetic field generating element in the axially deviated electrode. However, in the Einzel lens illustrated in FIG. 3, the deflection electric field generated when the electrode to which the voltage is applied is axially deviated is dominant, and the deflection electric field generated when the grounded electrode 41 or the grounded electrode 42 is axially deviated is very small. Therefore, in view of the manufacturing cost and the assembling property, it is preferable to dispose the magnetic field generating element only on the electrode 43 to which the voltage is applied.

First Embodiment: Summary

In the charged particle beam device 100 according to the first embodiment, the deflection field caused by the axis deviation of the center hole of the electrode is corrected by attaching the magnetic field generating element to the outer peripheral portion of the electrode to which the voltage is applied among the electrodes which constitute the electrostatic lens. In other words, the electrostatic lens itself which generates the deflection field due to the axis deviation corrects the deflection field and makes the electron beam 10 pass through. Therefore, it is possible to minimize the geometric aberration caused by the axis deviation, and to minimize the chromatic aberration by bringing the position through which the electron beam 10 passes closer to the wobbler center.

Second Embodiment

In a second embodiment of the invention, an operation example of optimizing the current amount supplied to the coil 46 will be described. Since the configuration other than the configuration for optimizing the current amount is the same as that of the first embodiment, current amount control will be mainly described below.

Figure 5:
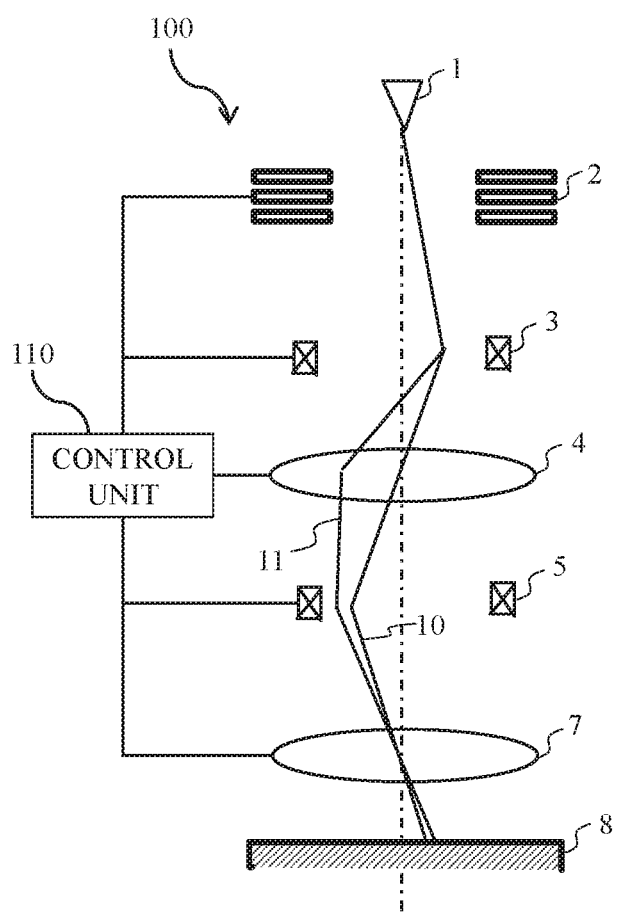
FIG. 5 shows two trajectories of an electron beam.

FIG. 5 shows two trajectories of the electron beam. The electron beam 10 passes through a wobbler center of the intermediate lens 4. When center holes of respective electrodes are axially deviated, a large geometric aberration may be generated in the intermediate lens 4 even when the electron beam 10 passes through the wobbler center of the intermediate lens 4. When the geometric aberration is generated, a focus deviation is generated due to a field curvature aberration generated in the intermediate lens 4. The focus deviation can be adjusted by controlling a current amount or a voltage value supplied to the objective lens 7 or a voltage value supplied to the sample 8 (collectively referred to as a focus correction amount). The magnitude of the focus deviation can be quantitatively compared by recording and comparing the current amount or the voltage value when a just-focus condition is set.

An electron beam 11 has a trajectory which passes through a wobbler center of the objective lens 7. In order to quantify the focus correction amount caused by the intermediate lens 4 with high accuracy, it is preferable to minimize the field curvature aberration generated by the objective lens 7. Therefore, the trajectory of the electron beam 11 can be used to quantify the focus correction amount.

A control unit 110 controls each of the acceleration electrode 2, the deflector 3, the intermediate lens 4, the deflector 5, and the objective lens 7. For example, the following can be controlled: (a) a deflection angle caused by each of the deflector 3 and the deflector 5; (b) a current or voltage supplied to the electrode of the intermediate lens 4 and the coil 46; (c) a focus correction amount by the objective lens 7; and (d) an acceleration voltage of the acceleration electrode 2. The control unit 110 may be configured by hardware such as a circuit device for implementing the function, or may be configured by a calculation unit executing software for implementing the function.

Figure 6:
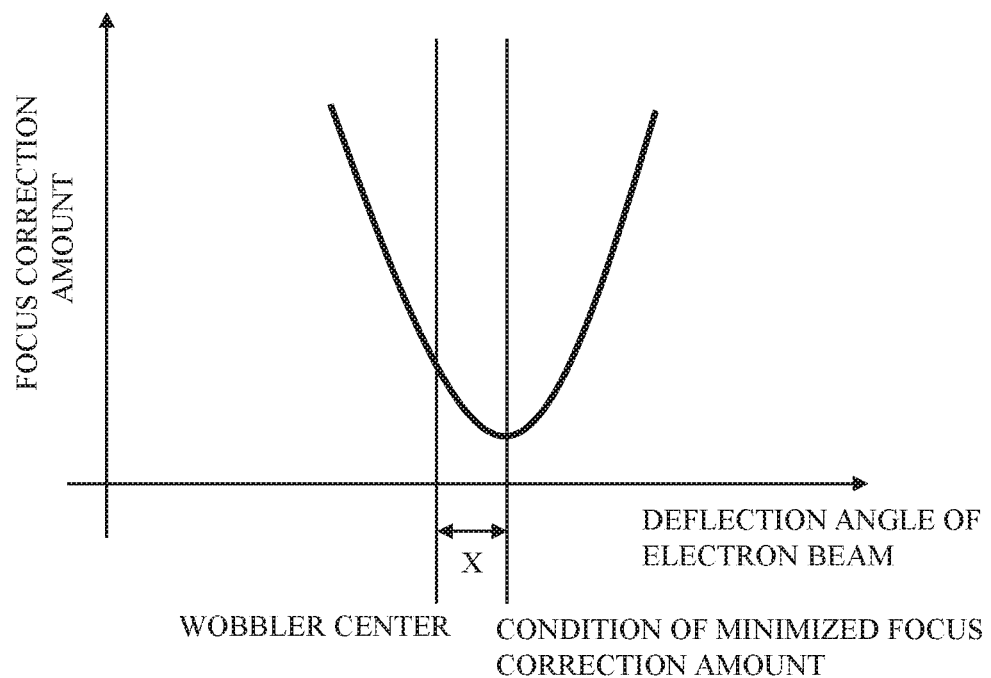
FIG. 6 is a diagram showing a relationship between a deflection angle of the electron beam caused by a deflector 3 and a focus correction amount.

FIG. 6 is a diagram showing a relationship between a deflection angle of the electron beam caused by the deflector 3 and the focus correction amount. While the current having a certain value is supplied to the coil 46, a deflection angle when the electron beam is deflected by the deflector 3 such that the electron beam passes through the wobbler center of the intermediate lens 4 is obtained. Further, a deflection angle when the focus correction amount is minimized is obtained. Two deflection angles may not necessarily match with each other, and may have a deviation X.

Although the relationship between the focus correction amount and the deflection angle is described in FIG. 6, other values may be used as long as the deflection angle can be specified. For example, a value corresponding to the deviation X in FIG. 6 can be obtained by using a relationship between a current amount supplied to the deflector 3 and the focus correction amount.

Figure 7:
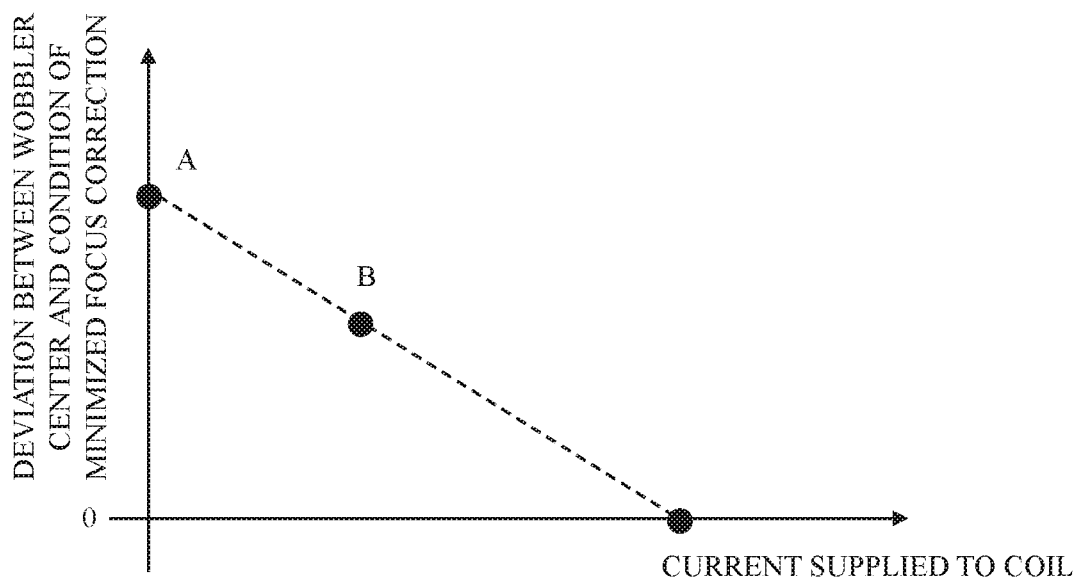
FIG. 7 is a diagram showing a procedure for optimizing a current supplied to a coil 46.

FIG. 7 is a diagram showing a procedure for optimizing the current supplied to the coil 46. First, when no current is supplied to the coil 46, the control unit 110 obtains the deviation X described in FIG. 6 and plots the current and the deviation X (point A in FIG. 7). Similarly, when a certain current amount is supplied to the coil 46, the control unit 110 obtains the deviation X and plots the current and the deviation X (point B in FIG. 7). The control unit 110 obtains a dotted line in FIG. 7 by repeating the above procedure while changing the current amount supplied to the coil 46. The current amount at which the deviation X is minimized is an optimum current to be supplied to the coil 46.

The controller 110 does not necessarily need to comprehensively change the current supplied to the coil 46. By obtaining the deviations X at least at two points in FIG. 7 (for example, point A and point B), the optimum current can be obtained using interpolation calculation. In order to more accurately obtain the optimum current, it is preferable to increase the measurement point as much as possible.

Second Embodiment: Summary

In the charged particle beam device 100 according to the second embodiment, the current amount supplied to the coil 46 to make a difference minimized is obtained between the deflection angle when the electron beam passes through the wobbler center of the intermediate lens 4 and the deflection angle of the electron beam when the focus correction amount by the objective lens 7 is minimized. Accordingly, the optimal condition which achieves the same effect as the first embodiment can be specified correctly.

Third Embodiment

Figure 8:
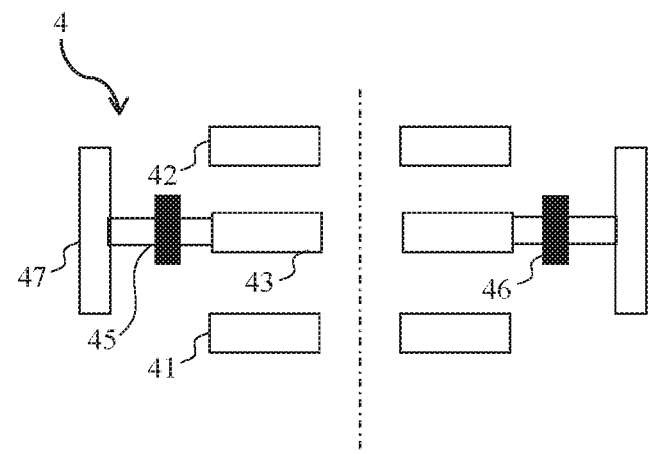
FIG. 8 is a configuration diagram of the intermediate lens 4 included in the charged particle beam device 100 according to a third embodiment.
Figure 8:
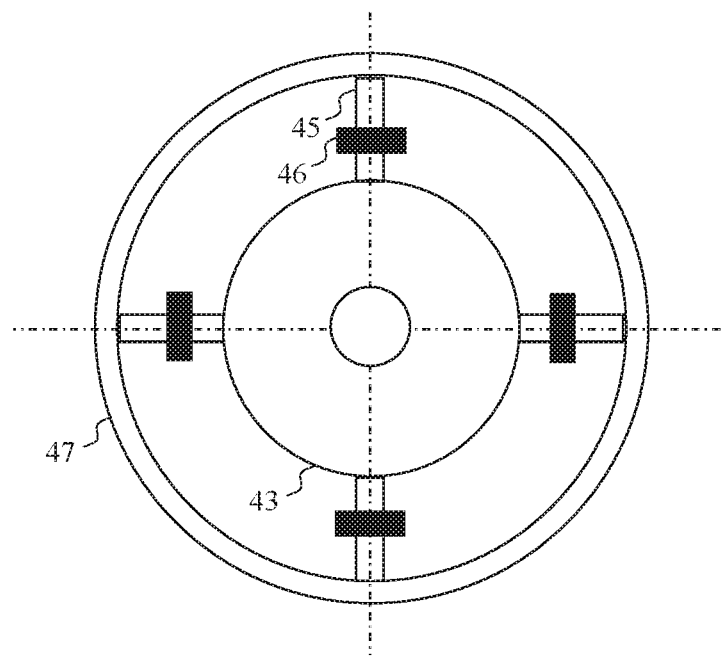

FIG. 8 is a configuration diagram of the intermediate lens 4 included in the charged particle beam device 100 according to a third embodiment of the invention. The upper part of FIG. 8 is a schematic side view. The lower part of FIG. 8 is a top view. In the third embodiment, the intermediate lens 4 includes a magnetic component 47 on the outer peripheral portion of the magnetic bar 45. Other configurations are the same as those of the first embodiment and the second embodiment.

When only the magnetic bar 45 and the coil 46 shown in FIG. 3 are used as the magnetic field generating elements, a magnetic force line coming out of the magnetic bar 45 passes through a space and is attracted to a magnetic body existing around components other than a component of the electrostatic lens. Such a path of the magnetic force line is not appropriate when it is desired to generate a deflection magnetic field efficiently. In the third embodiment, with an action of the magnetic component 47, the magnetic force line coming out of the magnetic bar 45 passes through the magnetic bar 45 disposed on an opposite side via the magnetic component 47. With such an arrangement, the magnetic force line which leaks into the space is reduced, and the deflection magnetic field can be efficiently generated. Therefore, since the current amount supplied to the coil 46 can be reduced, a heat generation amount and power consumption of the coil 46 can be reduced.

Fourth Embodiment

In the structure of the shape of the magnetic bar 45 illustrated in FIG. 3 or the magnetic component 47 illustrated in FIG. 8, depending on the material or shape of the electrode 41 and the electrode 42, or the arrangement or shape of a component formed of surrounding magnetic bodies (not shown), a deflection magnetic field generated when a current is supplied to the coil 46 may have a complicated shape with a plurality of peaks (side peaks other than the main peak). Since such a distribution shape of the deflection magnetic field does not match a distribution shape of a deflection electric field generated due to the axis deviation of the electrodes which constitute the electrostatic lens, it is difficult to eliminate the deflection electric field efficiently. In addition, in a rotationally symmetric focusing field of the electrostatic lens, the electron beam is deflected by the deflection magnetic field, so that aberration is generated, and the spatial resolution is thus decreased.

In order to make the distribution shape of the deflection magnetic field generated when the current is supplied to the coil 46 close to the distribution shape of the deflection electric field generated due to the axis deviation of the electrodes which constitute the electrostatic lens, it is effective to prevent magnetic force lines leaking from the magnetic bar 45 or the magnetic component 47 from leaking out with respect to the magnetic field distribution onto an optical axis of the electron beam (that is, a center axis of the center hole of the electrodes which constitute the electrostatic lens). In the fourth embodiment of the invention, a configuration example for the above will be described.

Figure 9:
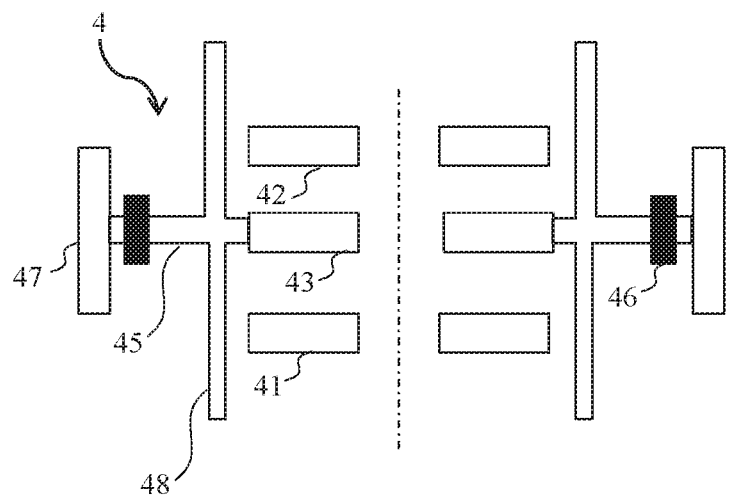
FIG. 9 is a configuration diagram of the intermediate lens 4 included in the charged particle beam device 100 according to a fourth embodiment.
Figure 9:
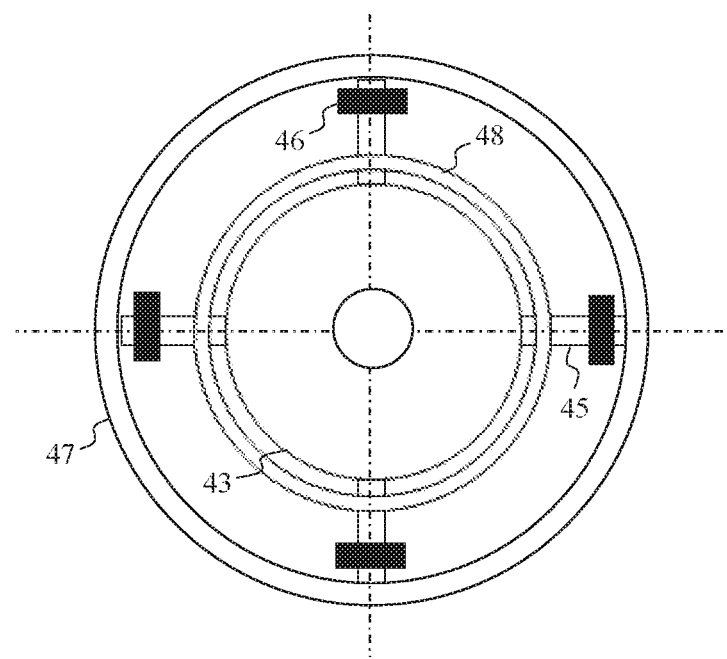

FIG. 9 is a configuration diagram of the intermediate lens 4 included in the charged particle beam device 100 according to the fourth embodiment. The upper part of FIG. 9 is a schematic side view. The lower part of FIG. 9 is a top view. In the fourth embodiment, the intermediate lens 4 includes a protrusion portion 48 formed of a magnetic body. The protrusion portion 48 is formed by branching the magnetic bar 45 along an optical axis direction. Alternatively, the protrusion portion 48 may be formed as a separate member and attached to the magnetic bar 45. Other configurations are the same as those of the first embodiment and the second embodiment.

In the structure shown in FIG. 9, the magnetic force line leaking from the magnetic bar 45 or the magnetic component 47 passes through the protrusion portion 48 and returns to the magnetic bar 45 again. Accordingly, this makes it difficult for the magnetic force line leaking from the magnetic bar 45 or the magnetic component 47 to leak onto the optical axis of the electron beam. As a result, it is possible to prevent a situation in which the distribution shape of the deflection magnetic field generated when the current is supplied to the coil 46 does not match the distribution shape of the deflection electric field due to the axis deviation of the electrode.

Figure 10:
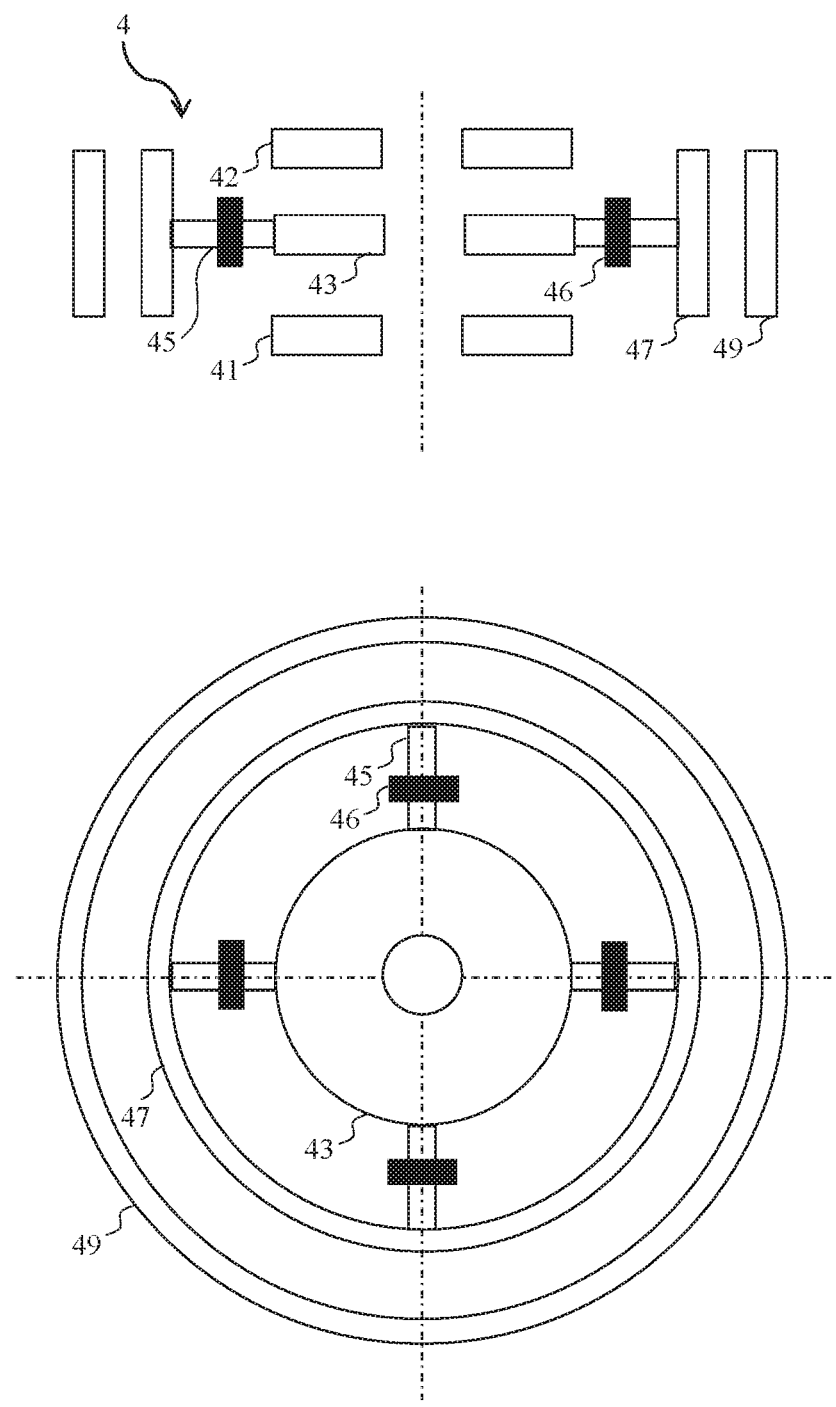
FIG. 10 is a diagram showing a modification of the fourth embodiment.

FIG. 10 is a diagram showing a modification of the fourth embodiment. The intermediate lens 4 shown in FIG. 10 includes a magnetic component 49 on an outer side of the magnetic component 47 instead of the protrusion portion 48. The magnetic component 47 and the magnetic component 49 may be connected to each other with a magnetic body (not shown). In the structure shown in FIG. 10, the magnetic force line leaking from the magnetic component 47 passes through the magnetic component 49, and returns to the magnetic component 47 from a position of the magnetic bar 45 disposed on an opposite side. As a result, as in the example of FIG. 9, it is possible to prevent a situation in which the distribution shape of the deflection magnetic field generated when the current is supplied to the coil 46 does not match the distribution shape of the deflection electric field due to the axis deviation of the electrode.

In FIG. 10, by further adding a new magnetic component to an outer side of the magnetic component 49, it is possible to further reduce the magnetic force line leaking from the magnetic component 47 leaks onto the optical axis. In this way, by disposing the magnetic component to have a multilayer structure on the outer peripheral portion of the electrode 43, the side peak of the deflection magnetic field can be prevented.

FIGS. 9 and 10 show examples in which another magnetic component is disposed on an inner side (FIG. 9) and the outer side (FIG. 10) of the magnetic component 47, respectively, which may be combined. That is, the same effect as that of the fourth embodiment can be achieved as long as the magnetic component is disposed to have the multilayer structure on the outer peripheral portion of the electrode 43.

Fifth Embodiment

Figure 11:
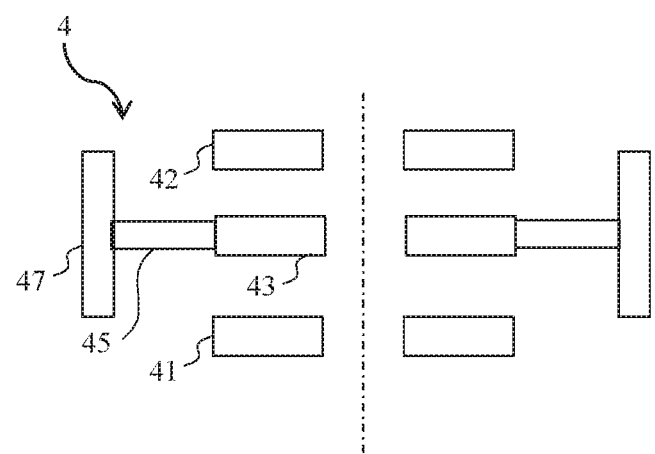
FIG. 11 is a configuration diagram of the intermediate lens 4 according to a fifth embodiment.
Figure 11:
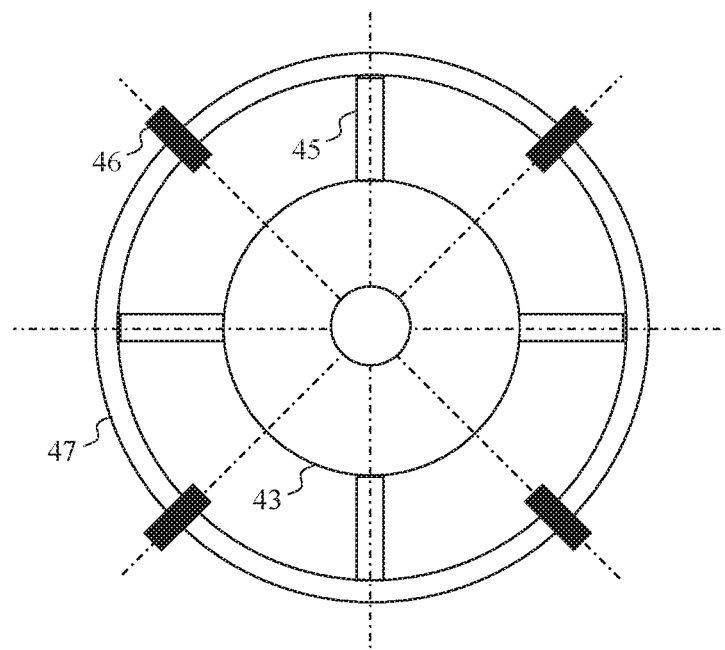

FIG. 11 is a configuration diagram of the intermediate lens 4 according to a fifth embodiment of the invention. When it is desired to shorten a length of the magnetic bar 45 or to increase the number of turns of the coil 46, it may be difficult to wind the coil 46 around the magnetic bar 45. In this case, as shown in FIG. 11, the coil 46 can be wound around the magnetic component 47. Other configurations are the same as those of the first to fourth embodiments. According to such an arrangement of the coil 46, the magnetic bar 45 can be shortened, and even when the number of turns of the coil 46 is large, the overall size of the electrostatic lens unit can be designed to be small.

Modification of Invention

The invention is not limited to the embodiments described above, and includes various modification examples. For example, the embodiments described above are described in detail for easy understanding of the invention, and the invention is not necessarily limited to the embodiment including all the configurations described above. In addition, a part of the configuration of a certain embodiment can be replaced with the configuration of another embodiment, and the configuration of another embodiment can be added to the configuration of the certain embodiment. It is possible to add, delete, and replace other configurations for a part of the configuration of each embodiment.

In the above embodiments, an example in which the charged particle beam device 100 is configured as the scanning electron microscope is described, but the invention can also be applied to other charged particle beam device. The reason why a charged particle beam is affected by the deflection electric field is the same as that in other charged particle beam device. For example, it is considered to apply the invention to a focused ion beam device.

In the above embodiments, an example in which the magnetic bar 45 and the coil 46 are attached to the outer peripheral portion of the electrode 43 as the magnetic field generating element is described, but the magnetic field generating element is not limited thereto. That is, other configurations may be adopted as long as the magnetic force line mainly passes through the electrode 43 and slightly leaks into the center hole of the electrode 43. For example, the magnetic field generating element may be disposed with a slight gap provided between the outer peripheral portion of the electrode 43 and the magnetic field generating element. Even in this case, since the magnetic field generating element and the electrode 43 are magnetically connected, the same effect as the invention can be achieved. Alternatively, the magnetic field generating element can be formed by leaving two holes at appropriate portions on the surface of the electrode 43 and winding the coil 46 around the hole. The magnetic field generating element may also be formed by any other appropriate methods.

REFERENCE SIGN LIST

1: electron source
2: acceleration electrode
3: deflector
4: intermediate lens
5: deflector
7: objective lens
8: sample
41 to 43: electrode
44: insulating member
45: magnetic bar
46: coil
47: magnetic component
48: protrusion portion
49: magnetic component 100: charged particle beam device

The invention claimed is:

1. A charged particle beam device which emits a charged particle beam to a sample, the charged particle beam device comprising:
a charged particle source which emits the charged particle beam;
an acceleration electrode which accelerates the charged particle beam emitted by the charged particle source;
an objective lens which focuses the charged particle beam on the sample;
an electrostatic lens which is disposed between the acceleration electrode and the objective lens; and
a deflector which is disposed between the acceleration electrode and the electrostatic lens, wherein
at least one of electrodes which constitutes the electrostatic lens is formed of a magnetic body, and
the charged particle beam device further comprising:
a magnetic field generating element which is magnetically connected to the electrode and generates a magnetic field having a function of deflecting the charged particle beam, wherein
two or more magnetic field generating elements are disposed along an outer periphery of the electrode; and
a control unit configured to control a current supplied to the magnetic field generating element such that a difference is minimized between a first deflection angle of the charged particle beam caused by the deflector when the charged particle beam passes through a wobbler center of the electrostatic lens and a second deflection angle of the charged particle beam caused by the deflector when a focus correction amount made by the objective lens is minimum.

2. The charged particle beam device according to claim 1, wherein
the magnetic field generating element is magnetically connected to the electrode by being in contact with and attached to the electrode.

3. The charged particle beam device according to claim 2, wherein
the magnetic field generating element includes a magnetic bar attached to the electrode and a coil wound around the magnetic bar.

4. The charged particle beam device according to claim 1, wherein
the magnetic field generating element is disposed to be at least two-fold rotationally symmetric or more around the electrode.

5. The charged particle beam device according to claim 1, wherein
the objective lens is configured to be able to correct a focusing position when the charged particle beam is emitted to the sample.

6. The charged particle beam device according to claim 5, wherein
the control unit obtains a first difference between the first deflection angle and the second deflection angle when a first current is supplied to the magnetic field generating element,
the control unit obtains a second difference between the first deflection angle and the second deflection angle when a second current is supplied to the magnetic field generating element, and
the control unit obtains a third current different from the first current and the second current such that the difference is minimized in the third current by performing interpolation between a first pair of the first current and the first difference and a second pair of the second current and the second difference.

7. The charged particle beam device according to claim 1, further comprising:
a first magnetic member which is disposed to surround the outer periphery of the electrode, wherein
the magnetic field generating element is disposed between the electrode and the first magnetic member, and is disposed to magnetically connect the electrode and the first magnetic member.

8. The charged particle beam device according to claim 3, further comprising:
a first magnetic member which is disposed to surround the outer periphery of the electrode, wherein
the magnetic bar is disposed between the electrode and the first magnetic member, and connects an outer surface of the electrode and an inner surface of the first magnetic member.

9. The charged particle beam device according to claim 8, further comprising:
a second magnetic member which is disposed to surround the outer periphery of the electrode.

10. The charged particle beam device according to claim 9, wherein
the second magnetic member is disposed between the electrode and the first magnetic member.

11. The charged particle beam device according to claim 10, wherein
the magnetic bar includes a first portion extending from the electrode toward the first magnetic member, and a second portion branched from the first portion,
the second portion extends along an emitting direction of the charged particle beam, and
the second magnetic member is formed by the second portion.

12. The charged particle beam device according to claim 9, wherein
the second magnetic member is disposed to surround the outer periphery of the first magnetic member.

13. The charged particle beam device according to claim 1, wherein
the magnetic field generating element includes a magnetic bar attached to the electrode and a coil,
the charged particle beam device further includes a first magnetic member disposed to surround the outer periphery of the electrode,
the magnetic bar is disposed between the electrode and the first magnetic member, and magnetically connects an outer surface of the electrode and the first magnetic member, and
the coil is wound around the first magnetic member.

14. The charged particle beam device according to claim 1, wherein
the electrode and the two magnetic field generating elements form a magnetic circuit from one of the magnetic field generating elements to the other of the magnetic field generating elements via the electrode.

15. The charged particle beam device according to claim 14, wherein
the electrode has a hole through which the charged particle beam passes, and
the electrode and the two magnetic field generating elements are disposed to form the magnetic circuit around the hole.

16. An electrostatic lens which focuses a charged particle beam, the electrostatic lens comprising:
a first electrode which is formed of a magnetic body;

a second electrode which generates an electric field interlocking with the first electrode; and a magnetic field generating element which is magnetically connected to the first electrode, generates a magnetic field having a function of deflecting the charged particle beam, and is configured to receive a current supplied to the magnetic field generating element such that a difference is minimized between a first deflection angle of the charged particle beam caused by a deflector when the charged particle beam passes through a wobbler center of the electrostatic lens and a second deflection angle of the charged particle beam caused by the deflector when a focus correction amount made by the objective lens is minimum;

wherein two or more magnetic field generating elements are disposed along an outer periphery of the electrode.

17. The electrostatic lens according to claim 16, wherein the magnetic field generating element is magnetically connected to the first electrode by being in contact with and attached to the first electrode.

18. The electrostatic lens according to claim 17, wherein the magnetic field generating element includes a magnetic bar attached to the first electrode and a coil wound around the magnetic bar.

19. The electrostatic lens according to claim 16, wherein the magnetic field generating element is disposed to be at least two-fold rotationally symmetric or more around the first electrode.

20. The electrostatic lens according to claim 16, further comprising:

a first magnetic member which is disposed to surround the outer periphery of the first electrode, wherein the magnetic field generating element is disposed between the first electrode and the first magnetic member, and is disposed to magnetically connect the first electrode and the first magnetic member.

21. The electrostatic lens according to claim 18, further comprising:

a first magnetic member which is disposed to surround the outer periphery of the first electrode, wherein the magnetic bar is disposed between the first electrode and the first magnetic member, and connects an outer surface of the first electrode and an inner surface of the first magnetic member.

22. The electrostatic lens according to claim 21, further comprising:

a second magnetic member which is disposed to surround the outer periphery of the first electrode.

23. The electrostatic lens according to claim 22, wherein the second magnetic member is disposed between the first electrode and the first magnetic member.

24. The electrostatic lens according to claim 23, wherein the magnetic bar includes a first portion extending from the first electrode toward the first magnetic member, and a second portion branched from the first portion, the second portion extends along an emitting direction of the charged particle beam, and the second magnetic member is formed by the second portion.

25. The electrostatic lens according to claim 22, wherein the second magnetic member is disposed to surround the outer periphery of the first magnetic member.

26. The electrostatic lens according to claim 16, wherein the magnetic field generating element includes a magnetic bar attached to the first electrode and a coil, the electrostatic lens further includes a first magnetic member disposed to surround the outer periphery of the first electrode, the magnetic bar is disposed between the first electrode and the first magnetic member, and magnetically connects an outer surface of the first electrode and the first magnetic member, and the coil is wound around the first magnetic member.

27. The electrostatic lens according to claim 16, wherein the first electrode and the two magnetic field generating elements form a magnetic circuit from one of the magnetic field generating elements to the other of the magnetic field generating elements via the first electrode.

28. The electrostatic lens according to claim 27, wherein the first electrode has a hole through which the charged particle beam passes, and the first electrode and the two magnetic field generating elements are disposed to form the magnetic circuit around the hole.

* * * * *